United States Patent [19]
Andrews, Jr. et al.
[11] 3,719,797
[45] March 6, 1973

[54] SOLID STATE TEMPERATURE SENSOR EMPLOYING A PAIR OF DISSIMILAR SCHOTTKY-BARRIER DIODES

[75] Inventors: John Marshall Andrews, Jr., South Whitehall; Martin Paul Lepselter, Hanover Township, Northampton County, both of Pa.

[73] Assignee: Bell Telephone Laboratories, Incorporated, Murray Hill, N.J.

[22] Filed: Dec. 16, 1971

[21] Appl. No.: 208,614

[52] U.S. Cl................219/501, 73/362 SC, 307/310, 317/235 Q, 317/235 T, 317/235 UA, 317/235 R

[51] Int. Cl..............................................H01l 19/00

[58] Field of Search........317/235 Q, 235 T, 235 UA; 307/310; 73/362 SC; 219/501

[56] References Cited

UNITED STATES PATENTS

| | | | |
|---|---|---|---|
| 3,383,614 | 5/1968 | Emmons et al. | 317/235 T |
| 3,420,104 | 1/1969 | Troemel et al. | 317/235 T |
| 3,440,883 | 4/1969 | Lightner | 317/235 Q |
| 3,665,218 | 5/1972 | Andrews | 317/235 UA |

*Primary Examiner*—John W. Huckert
*Assistant Examiner*—William D. Larkins
*Attorney*—R. J. Guenther et al.

[57] ABSTRACT

The invention provides a solid state temperature sensor having significantly better sensitivity than conventional thermocouples. Basically, the sensor includes a pair of serially connected Schottky-barrier diodes of unequal barrier height and having geometries adapted such that each diode conducts the same reverse current at a given reverse bias and temperature. Because Schottky-barrier diodes of unequal barrier height have unequal thermal coefficients of reverse-biased resistance, the voltage at the common node between the diodes varies with temperature. Such voltage variation is useful for driving heating and/or cooling apparatus to stabilize the temperature of a semiconductor device and, additionally, for driving temperature indicators as in conventional thermometry.

11 Claims, 6 Drawing Figures

PATENTED MAR 6 1973 3,719,797

SOLID STATE TEMPERATURE SENSOR EMPLOYING A PAIR OF DISSIMILAR SCHOTTKY-BARRIER DIODES

BACKGROUND OF THE INVENTION

This invention relates generally to solid state devices; and, more particularly, to solid state temperature sensors employing a pair of dissimilar Schottky-barrier diodes.

As is well known in the art, the operating characteristics of many conventional solid state devices, including semiconductor integrated circuits, are inherently temperature sensitive; and, accordingly, it is often desired to monitor the operating temperature of such devices for a variety of reasons. Such reasons include, but are not limited to, the monitoring of heat flow patterns as a thermal design aid and the monitoring of operating temperature in normal operation for providing a warning signal that thermal runaway, avalanche breakdown, or some other manifestation of overheating is occurring or for deriving a signal with which to drive a thermal stabilization mechanism.

Because the normal operating temperature of such devices are typically less than about 200° C., it is advantageous to have a solid state thermometer (temperature sensor) which is both especially sensitive in that temperature range and which is compatible from a fabrication viewpoint with the solid state device whose temperature is to be monitored.

Conventional thermocouples, such as platinum versus platinum-rhodium and iron versus constantan, unfortunately are neither especially sensitive nor fabricationally compatible with conventional solid state devices.

A wide variety of semiconductor temperature-sensing means has been disclosed heretofore. However, all presently known forms of such disclosed temperature sensors suffer either from an undue degree of complexity and cost or from a lack of sensitivity, or both. For example, U.S. Pat. No. 3,349,599, issued June 10, 1969, to J. J. Henry, discloses a temperature control circuit which includes a pair of matched semiconductor diodes in a balanced bridge arrangement with a resistor and a thermistor, the output of the balanced bridge being used to drive an amplifier and an appropriate control element. Although reasonably accurate, the Henry circuit is unduly complex, costly, and large in physical size due to the inclusion of resistors and thermistors. Another known disclosure, in U.S. Pat. No. 3,444,399, issued May 13, 1969, to W. N. Jones, teaches a combination of positive temperature coefficient and negative temperature coefficient thermistors and also is clearly unduly complex in circuitry as well as in the difficulty of fabricating both negative and positive temperature coefficient thermistors in an integrated circuit.

SUMMARY OF THE INVENTION

In view of the above-described and other limitations of prior art temperature-sensing apparatus, it is an object of the instant invention to provide an especially sensitive solid state temperature sensor which is compatible with conventional solid state devices and, in particular, which is compatible with silicon integrated circuits.

It is a further object of this invention to provide a solid state temperature sensor in accordance with the immediately preceding object and which is extremely small in size so as to be economically advantageous for use in connection with silicon integrated circuits where size is often a controlling factor in cost.

In apparatus in accordance with this invention, advantage is taken of the basic fact that the specific resistivities of reverse-biased Schottky-barrier diodes have thermal coefficients which are very nearly a linear function of the barrier height. This basic fact was reported by the instant inventors in an article, "Ohmic Contacts to Silicon," appearing in the book *Ohmic Contacts to Semiconductors*, edited by B. Schwartz published by The Electrochemical Society, Inc., 1969, pp. 159–186. See especially equation 12, p. 163; Table 2, p. 173; and FIG. 7, pp. 178–179.

In accordance with the aforementioned basic fact, apparatus in accordance with the instant invention includes a pair of serially disposed Schottky-barrier diodes having unequal barrier heights and advantageously, but not necessarily, having their effective barrier areas adjusted such that each diode conducts the same reverse current at a given reverse bias and temperature. Because the Schottky-barrier diodes have unequal barrier heights, they have unequal thermal coefficients of reverse-biased specific resistance. Accordingly, in an appropriate circuit the voltage at a common node between the diodes can be made to vary with temperature. Such voltage variation can, of course, be used for driving heating and/or cooling apparatus to stabilize the temperature of a solid state device and, additionally, for driving temperature indicators as in conventional thermometry.

More specifically, in accordance with a basic embodiment of this invention, a pair of dissimilar Schottky-barrier diodes are serially disposed between a DC voltage source and ground, with the common node between the diodes being the output node of the embodiment. Advantageously, the diodes are designed with sufficiently unequal barrier heights and concomitant inversely proportional unequal effective barrier areas such that for a given operating reverse bias both diodes conduct the same amount of reverse current at the desired reference temperature about which the temperature sensing is to be accomplished.

Although it will be apparent that there are a great variety of ways of fabricating the above-described basic embodiment, the presently preferred form is to sinter a given particular metal to a silicon surface portion of N-type semiconductivity and also to a separate silicon portion of P-type semiconductivity. As is known, a given metal forms a different Schottky-barrier height when disposed contiguous with opposite semiconductivity types of the same semiconductor material. This embodiment is preferred, inasmuch as it will be appreciated that it is completely and directly compatible with and can be formed in small areas upon a standard silicon integrated circuit whose temperature it may be desired to monitor.

Other described embodiments in the detailed description hereinbelow are provided merely to illustrate various representative ways of utilizing output of the above-described basic embodiment, such as, for example, for amplifying and for driving generalized utilization circuitry, such as digital read-out thermometers.

BRIEF DESCRIPTION OF THE DRAWING

The aforementioned and other objects, features, and advantages of our invention will be more readily understood from the following detailed description taken in conjunction with the accompanying drawing in which.

Figure 3:
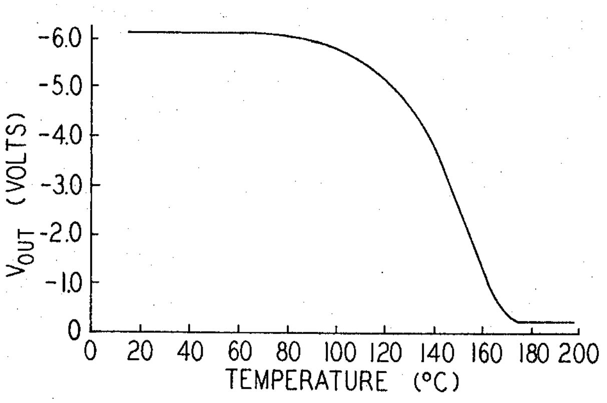
FIG. 3 is a graph depicting the experimentally observed voltage output as a function of temperature in a particular embodiment of the type depicted in FIG. 2.

It will be appreciated that for simplicity and clarity of explanation the figures, except for the graph of FIG. 3, have not necessarily been drawn to scale.

DETAILED DESCRIPTION OF THE DRAWING

Figure 1:
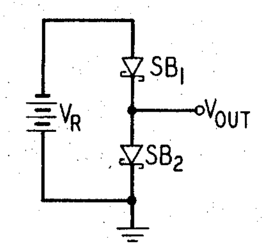
FIG. 1 is a schematic circuit representation of the basic embodiment of this invention.

More particularly now with reference to FIG. 1, there is shown a schematic circuit diagram including first and second serially disposed Schottky-barrier diodes denoted by reference numerals $SB_1$ and $SB_2$ disposed between a DC bias source $V_R$ and ground and having an output terminal designated $V_{OUT}$ connected to the common node between the diodes. For the purposes of this figure and for the subsequent figures, the DC bias $V_R$ will be assumed to be such as to provide reverse bias for the Schottky-barrier diodes. Of course, this implies that $V_R$ is a source of negative DC voltage in the circuit of FIG. 1.

In the apparatus depicted in FIG. 1, Schottky-barrier diodes $SB_1$ and $SB_2$ have unequal barrier heights and, advantageously, have effective barrier areas adjusted such that with a given current flowing from ground to the negative voltage source $V_R$, the voltage across each diode is one-half $V_R$ at a given reference temperature $T_o$. This advantage will be clarified hereinbelow by reference to the thermal transfer characteristics of the apparatus.

To achieve such a design, it is first recognized that the apparatus of FIG. 1 is subject to two fundamental constraints, in addition to the design constraint of having the voltage across each diode be one-half $V_R$ at the reference temperature. First, the reverse currents through the diodes are equal. And, second, the sum of the reverse voltages subtended by each diode is equal to the supply voltage $V_R$. Employing the standard diode equation for each diode $SB_1$ and $SB_2$ subject to these constraints, the current and voltage terms cancel out since they are equal for each diode at the reference temperature $T_o$, and one obtains the following equation $$\exp\left[\frac{q(\varphi_{B1}-\varphi_{B2})}{kT_o}\right]=\frac{A_1}{A_2} \quad (1)$$

where: $\phi_{B1}$ is the barrier height of diode $SB_1$ for the given voltage thereover; $\phi_{B2}$ is the barrier height of diode $SB_2$ for the given voltage thereover; $T_o$ is the selected reference temperature about which operation is to take place; $A_1$ is the effective barrier area of diode $SB_1$; and $A_2$ is the effective barrier area of diode $SB_2$.

As reported in an article by the instant inventors, entitled "Reverse Current-Voltage Characteristics of Metal-Silicide Schottky Diodes," *Solid State Electronics*, Vol. 13, pp. 1011–1023 (1970), the effective barrier height, $\phi_B$ of a Schottky-barrier diode is variable with applied reverse voltage approximately in accordance with the following equation $$\phi_B=\phi_{BO}-(qEm/4\pi\epsilon_S)^{1/2}-\alpha E_m \quad (2)$$

where: $\phi_B$ is the effective barrier of the diode for a given reverse voltage thereover; $\phi_{BO}$ is the effective potential barrier at the metal-semiconductor interface at vanishing electric field; $E_m$ is the maximum electrostatic field at the metal-semiconductor interface of the diode for a given applied voltage; $\epsilon_S$ is the electrical permittivity of the semiconductor; and $\alpha$ is the rate of change of electrostatic barrier height with respect to electric field.

As reported at page 161 of the above-referenced book, *Ohmic Contacts to Semiconductors*, the maximum electrostatic field, $E_m$, is dependent on applied reverse voltage, $V_R$, in the following manner:

$$E_m=\sqrt{\frac{2qN_{D,A}}{\epsilon_S}\left(V_R+V_D-\frac{kT}{q}\right)} \quad (3)$$

where: $N_{D,A}$ is the doping concentration, either Donor or Acceptor, at the metal-semiconductor interface; and $V_D$ is a variable constant equal to $\phi_B-E_c+E_f$ where $E_c$ is the conduction band energy and $E_f$ is the Fermi level energy.

It will be seen that the foregoing equations are not readily solved directly; and so iterative techniques advantageously are employed to find the correct area ratio ($A_1/A_2$) for a given barrier height difference ($\phi_{B1}-\phi_{B2}$) and a given reverse voltage (one-half $V_R$). Alternatively, of course, values of $\phi_B$ can be determined empirically to avoid use of Equations 2 and 3 above.

Using empirically determined values of $\phi_B$ and Equation 1, apparatus of the type depicted in FIG. 1 was designed where Schottky-barrier diode $SB_1$ included rhodium silicide in contact with N-type silicon doped to a concentration ($N_D$) of about $10^{15}$ donors per cubic centimeter, resulting in an effective Schottky-barrier height ($\phi_B$) of about 0.6783 electron volts at vanishing electric field, an effective $\alpha$ of about 35 angstroms, and an effective circular barrier diameter of about 7.65 mils ($7.65 \times 10^{-3}$ inches). In this embodiment, the second Schottky-barrier diode $SB_2$ included zirconium silicide in contact with N-type silicon, also doped to a concentration ($N_D$) of about $10^{15}$ donors per cubic centimeter, giving an effective barrier height ($\phi_B$) of about 0.5518 electron volts at vanishing electric field, an effective $\alpha$ of about 15 angstroms, and an effective circular barrier area of diameter of about 1 mil ($1 \times 10^{-3}$ inches).

In operation, with $V_R = 5$ volts, such apparatus was calculated to exhibit an output voltage of about one-half the applied bias $V_R$ at a reference temperature of 300° K. and to exhibit a sensitivity of about 80 millivolts per degree Kelvin.

In this context, of course, sensitivity is defined as the slope of the output voltage with respect to temperature, or, more precisely, the derivative of the output voltage with respect to temperature. Since the thermally activated reverse leakage currents in the diodes are controlled by effective barrier heights that are dependent upon electric field, the individual diodes $SB_1$ and $SB_2$ exhibit nonsaturating reverse characteristics. More specifically, as reported in the aforementioned article in *Solid State Electronics*, the reverse current density, $J_R$, of a Schottky-barrier diode is given by the equation $$J_R = A^{**}T^2\exp(-q\phi_{B/kT})[1-\exp(-qV_{R/kT})] \quad (4)$$

where: $A^{**}$ is the effective Richardson constant for the metal-semiconductor interface; $T$ is temperature in degrees Kelvin; $q$ is the electronic charge; $\phi_B$ is the effective potential barrier at the metal-semiconductor interface, in electron volts; $k$ is Boltzmann's constant; and $V_R$ is the applied reverse bias across the metal-semiconductor interface, in volts. The total current flowing through the diode at a given reverse voltage is found simply by multiplying the current density ($J_R$) by the effective barrier area of the diode in question.

It will be apparent that reverse voltage ($V_R$) as a function of reverse current is not easily determined from Equation 4; and the difficulty is severely compounded by the fact, as is implicit in Equations 2 and 3 above, that for a Schottky-barrier diode the effective barrier height $\phi_B$ is variable with applied voltage. Accordingly, the thermal transfer characteristic, i.e., $V_{OUT}$ as a function of temperature, is not readily expressed in a closed mathematical expression; and it is therefore expedient to calculate the transfer characteristic numerically using iterative procedures.

Of course, it will be apparent that a great variety of apparatus of the type depicted in FIG. 1 can be constructed subject to the constraints and in conformity with the equations given hereinabove and as further described in the aforementioned article in *Solid State Electronics*.

Figure 2:
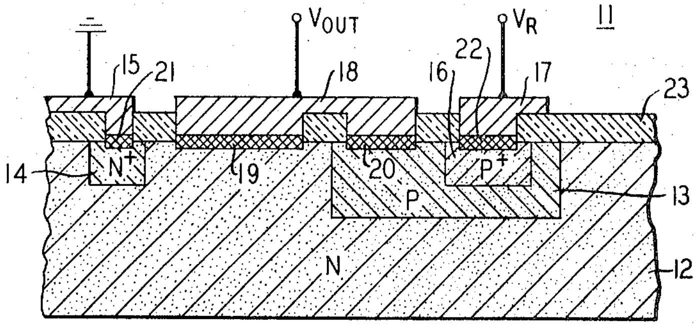
FIG. 2 is a cross-section of one small portion of a semiconductor wafer including a preferred integrated circuit form of the basic embodiment depicted in FIG. 1.

An example of a preferred form of such apparatus is depicted in FIG. 2 where there is shown a cross-section of a small portion 11 of a semiconductor wafer including an N-type bulk portion 12 doped, for example, to a concentration of about $10^{15}$ donors per cubic centimeter. Bulk portion 12 includes a heavily doped $N^+$-type zone 14, a P-type localized surface zone 13 doped, for example, to a concentration of about $10^{16}$ acceptors per cubic centimeter, and, in zone 13, a heavily doped $P^+$-type zone 16. An apertured dielectric passivating layer 23 of the type commonly used in integrated circuits is disposed over the surface of portion 11.

Double cross-hatched features 19–22 indicate regions of metallic silicide formed, for example, by sintering a metal, e.g., nickel, to localized portions of the surface. Typically, apertures are opened in dielectric 23; a thin metallic sheet is formed over the entire layer and in the apertures; and the structure is heated sufficiently to sinter the metal in the apertures to the semiconductor. The metal over the dielectric portions is then removed by etching in a solution which does not attack the sintered portions. Thereafter, a plurality of electrodes 15–18 are formed in contact with silicides 19–22 by any of a variety of techniques known in the art, e.g., a conventional tri-metal electrode system such as the titanium-platinum-gold system may be used.

More specifically now, in accordance with this invention, double cross-hatched portions 19 and 20 are of carefully controlled lateral dimensions, inasmuch as these portions provide parts of diodes $SB_1$ and $SB_2$, respectively. As is known in the art, a metallic silicide such as feature 19 in contact with lightly doped N-type silicon 12 forms a rectifying Schottky-barrier diode in which the metallic silicide 19 is the anode and the N-type silicon 12 is the cathode. Similarly, a metallic silicide such as feature 20 in contact with lightly doped P-type silicon 13 forms a rectifying Schottky-barrier in which the metallic silicide 20 is the cathode and the P-type silicon 13 is the anode. Accordingly, it is seen that in FIG. 2 the diode of which metallic silicide 19 is a part provides diode $SB_1$ in FIG. 1; and the diode of which metallic silicide 20 is a part provides diode $SB_2$ in FIG. 1. Thus, it is seen that, in FIG. 2, electrode 18 provides a connection to the common node between diodes $SB_1$ and $SB_2$, with metal silicide 19 providing the anode of diode $SB_1$ and metal silicide 20 providing the cathode of diode $SB_2$.

It is also known in the art that a given metallic silicide usually forms a different Schottky-barrier on N-type semiconductor than on P-type semiconductor. Thus, the same metallic silicide can be used for both silicide portions 19 and 20. This clearly is a considerable fabrication advantage over having to form different metallic silicides for diodes $SB_1$ and $SB_2$.

Also of considerable advantage in the structure of FIG. 2 is that the diodes can be so conveniently connected in series-aiding polarity simply by a common metallic portion such as 18 in contact with silicides 19 and 20. If diodes $SB_1$ and $SB_2$ were formed using different metals both in contact with N-type silicon to achieve the different barrier heights, the N-type silicon portions would need to be electrically isolated from each other because both N-type portions would be cathodes and the N-type portion of one diode would have to be connected to the silicide portion of the other diode to achieve the series-aiding polarity requisite to this invention. Such would clearly be much less convenient to fabricate than is the structure of FIG. 2.

In FIG. 2, heavily doped $N^+$-type zone 14 and heavily doped $P^+$-type zone 16 are provided for convenience of fabrication so that the same metal used for electrode 18 can be used also to provide low resistance, substantially ohmic contact when sintered to bulk portion 12 and P-type anode 13. As is known in the art, a metallic silicide in contact with a heavily doped semiconductive portion tends to form an ohmic connection rather than a Schottky-barrier. For the purposes of this invention, it has been found that silicides in contact with silicon doped to a concentration (N or P) greater than about $10^{18}$ per cubic centimeter provide essentially ohmic connection, at least sufficiently ohmic that they are not suitable for use as the diodes $SB_1$ and $SB_2$ of this invention. Silicides contiguous with silicon doped to less than $10^{18}$ (preferably equal to or less than $10^{16}$) can be used for such diodes.

It will also be appreciated that $P^+$-type zone 16 can be omitted without significant detriment to performance because any Schottky-barrier diode formed between electrode 17 and P-type zone 13 would be forward-biased in operation and so would have little effect on operation. However, any diode formed between electrode 15 and N-type zone 12 would significantly affect operation because it would be reverse-biased.

Referring now to FIG. 3, there is shown a graph depicting the observed transfer characteristic, i.e., $V_{OUT}$ as a function of temperature, for a particular device of the type depicted in FIG. 2. More particularly, the observed apparatus employed a tri-level metallization (Ti-Pt-Au) for the metal of electrodes 15, 17, and 18 and nickel silicide for the metallic silicide portions 19–22, giving a $\phi_{BO}$ of about 0.66 electron volts with respect to N-type portion 12 and a $\phi_{BO}$ of about 0.45 electron volts with respect to P-type portion 13. In fabricating this device, an area ratio ($A_n/A_p$) of 625 was selected arbitrarily for convenience; and in accordance with the previously given equations, this area ratio should have resulted in a $T_o$ of about 100° C.

However, as seen in FIG. 3, the temperature at which $V_{OUT}$ is one-half the supply voltage of 6.2 volts is about 145° C. This difference from the calculated value is due to non-ideal behavior of the Schottky-barrier diodes, the primary contribution being believed to be due to the absence of guard rings around the periphery of the barrier areas in the structure of FIG. 2. It is well known in the art that one does not usually achieve ideal diode behavior, i.e., in accordance with the above-given diode equations, in planar Schottky-barrier diodes without guard rings. However, this difference from ideal behavior should not be thought to detract from the invention. It merely suggests that one should use guard rings or adjust the area ratios empirically to achieve a desired reference temperature $T_o$.

It is also seen in FIG. 3 that the greatest sensitivity, i.e., rate of change of $V_{OUT}$ with respect to temperature, occurs when $V_{OUT}$ is about one-half the supply voltage, with the rate remaining substantially constant at about minus 0.13 volts per degree centigrade from about 130° C. to about 165° C., for the observed device. This is more than three orders of magnitude greater sensitivity than that of iron versus constantan thermocouples (about $5 \times 10^{-5}$ volts per degree centigrade at 100° C.) and more than four orders of magnitude greater than that of platinum versus platinum-rhodium thermocouples (about $8 \times 10^{-6}$ volts per degree centigrade at 100° C.), the latter sensitivities being those listed for the named thermocouples in *Handbook of Chemistry and Physics*, C. D. Hodgman, editor, Chemical Rubber Co., 44th edition, (1962–63). In addition, it is readily seen that the apparatus of FIG. 2 is completely compatible with modern semiconductor integrated circuits, while the above-mentioned and other conventional thermocouples clearly are not.

As a concluding comment on sensitivity, it is considered an important aspect of this invention that the sensitivity of the sensor can be adjusted as desired by appropriate selection of barrier height differences. More specifically, it can be shown that the sensitivity of apparatus in accordance with this invention varies monotonically with increase in the difference between the barrier heights of the two diodes. However, it must be observed that as the difference in barrier heights is increased the area ratio also increases exponentially and can become impractically large. Thus, in practice one balances an acceptably high sensitivity with a practical area ratio.

Figure 4:
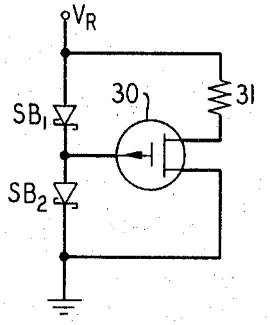
FIG. 4 is a schematic circuit diagram showing the sensor of FIG. 1 in combination with an IGFET amplifier and heating means.

Referring now to FIG. 4, there is shown a schematic circuit diagram including a sensor as in FIG. 1 in combination with a P-channel insulated gate field-effect transistor (IGFET) amplifier 30 and a resistor 31 connected between the drain of IGFET 30 and the negative voltage source $V_R$. The gate of IGFET 30 is connected to the common node between diodes $SB_1$ and $SB_2$; and the source of IGFET 30 is connected to ground along with the cathode of diode $SB_1$.

In operation, resistor 31 serves as a resistance heater which produces more heat as temperature decreases. Thus, the apparatus of FIG. 4 can be used to stabilize the operating temperature of other apparatus in close thermal relationship therewith, for as temperature decreases the increased heat produced by resistor 31 tends to reestablish a higher temperature.

That the apparatus of FIG. 4 does, in fact, produce more heat as temperature decreases can be readily seen with reference to FIG. 3, where it is shown that $V_{OUT}$ increases to a more negative value as temperature (for this case, in the range of about 80° to 180° C.) decreases. Inasmuch as IGFET 30 is a P-channel IGFET, greater negative gate voltage produces greater source-drain current which, in turn, causes greater $I^2R$ heating in resistor 31.

Of course, it will be appreciated that, if the positions of diodes $SB_1$ and $SB_2$ are interchanged, $V_{OUT}$ would move toward ground as temperature decreases. In this case, of course, an N-channel device could be used for IGFET 30 instead of the illustrated P-channel device to achieve the same desired operation.

Figure 5:
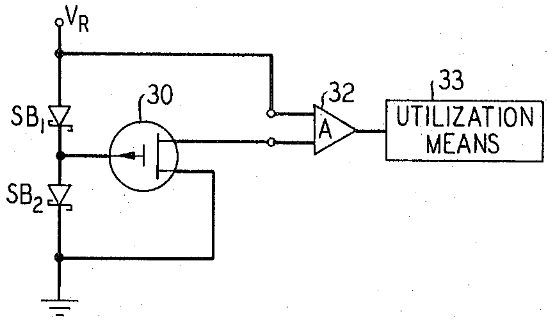
FIG. 5 is a schematic circuit diagram similar to FIG. 4 except that a further stage of amplification and a generalized utilization means is shown instead of the heating means.

Referring briefly now to FIG. 5, there is shown a schematic circuit diagram of apparatus like that of FIG. 4, except that resistor 31 has been replaced by a further stage of amplification 32 driving a generalized utilization means 33. Utilization means 33 may, of course, be any of a wide variety of apparatus, such as: a servomechanism for controlling more sophisticated heating means and/or cooling means; a digital readout thermometer; a buzzer or other warning device to indicate thermal runaway, avalanche breakdown, or less severe overheating; or any of a variety of other indicators for studying heat flow patterns as a thermal design aid. In this context, it should be appreciated that the inventive apparatus also provides the possibility for a microscopic thermal monitor in difficult areas where larger and less sensitive conventional devices could not be used.

Figure 6:
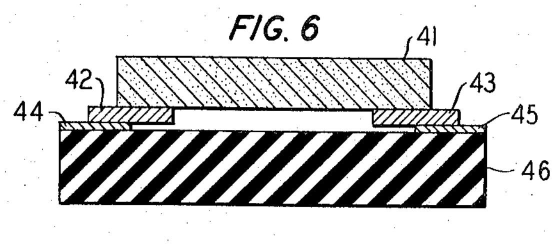
FIG. 6 is a generalized cross-section of an integrated circuit structure employing a temperature sensor in accordance with this invention.

Referring now to FIG. 6, there is shown a generalized cross-sectional view of an integrated circuit employing a temperature sensor in accordance with this invention. A semiconductor wafer 41 having conductive beam lead connections 42 and 43 is registered with and attached to corresponding preformed conductive portions 44 and 45 on an insulating substrate 46, e.g., a circuit board as disclosed, for example, in U.S. Pat. No. 3,426,252, issued Feb. 4, 1969, to M. P. Lepselter and assigned to the assignee hereof.

As presently contemplated, a temperature sensing and/or control circuit such as shown in FIG. 2 can be included as a small portion of wafer 41 in FIG. 6. There may be a plurality of wafers 41, each including its own control circuit attached to a single insulating substrate, such as 46. In this manner, the close thermal conductive properties of each semiconductor wafer enable close thermal relationship between the control circuit and the controlled circuits in each wafer.

Alternatively, there may be provided a separate wafer providing the temperature sensing and/or control circuit mounted on a single insulating substrate along with other wafers, such as 41, which do not contain their own control circuits. In this case, the electrode connections 42–45 and the insulating substrate 46 are advantageously selected to provide close thermal relationship between the wafer(s) which contain the thermal control circuit(s) and those wafers which do not.

Although the invention has been described in part by making detailed reference to certain specific embodiments, such detail is intended to be and will be understood to be instructive rather than restrictive. It will be appreciated by those in the art that many variations not expressly set forth may be made in the structures and modes of operation without departing from the spirit and scope of this invention as disclosed herein. It will be appreciated, for example, that the conductivity types in the disclosed embodiments may be interchanged, provided suitable changes in voltage polarities also are made. It will be appreciated also that, while the disclosure has been in terms of diodes disposed between ground and some negative voltage, the apparatus could as well be disposed between any reference potential other than ground, provided only that the voltage source $V_R$ is made suitably more negative.

It will also be appreciated, of course, that materials other than silicon, e.g., gallium arsenide and other semiconductors and semi-insulating semiconductors, also can be used to provide a portion of the Schottky-barrier diodes, all being within the scope of this invention.

What is claimed is:

1. Solid state temperature sensing apparatus comprising first and second rectifying Schottky-barriers disposed in series-aiding polarity with a common portion therebetween providing an output terminal, the first and second Schottky-barriers being substantially dissimilar in both barrier height and effective barrier area, such that with the same reverse current flowing through both Schottky-barriers the voltage at the output terminal varies with the operating temperature of the Schottky-barriers, means for applying a voltage over the series combination of Schottky-barriers for producing substantially equal reverse currents through said Schottky-barriers, and, a temperature indicating means coupled to the output terminal and responsive to voltages thereupon.

2. Apparatus as recited in claim 1 wherein the barrier height and barrier area of the first Schottky-barrier are related to the barrier height and barrier area of the second Schottky-barrier such that at a predetermined operating temperature and with a predetermined reverse current flowing through both Schottky-barriers the voltage subtended by the first Schottky-barrier is the same as the voltage subtended by the second Schottky-barrier.

3. Apparatus as recited in claim 1 wherein:

the first Schottky-barrier includes a metallic silicide in rectifying barrier relationship with N-type silicon;

the second Schottky-barrier includes the same type metallic silicide in rectifying barrier relationship with P-type silicon; and the common portion therebetween is a metal electrode in contact with both metallic silicides.

4. Apparatus as recited in claim 3 wherein: the N-type and P-type portions are included in a semiconductive wafer which further includes a heavily doped $N^+$-type portion contiguous with the N-type portion for facilitating ohmic contact thereto.

5. Apparatus as recited in claim 4 further including a metallic silicide contiguous with and making substantially ohmic contact to the $N^+$-type portion, this last-mentioned metallic silicide being of the same type as the metallic silicides forming the rectifying barriers.

6. A temperature regulating system, comprising a. solid state temperature sensing apparatus including first and second rectifying Schottky-barriers disposed in series adding polarity with a common portion therebetween providing an output terminal, the first and second Schottky-barriers being substantially dissimilar in both barrier height and effective barrier area such that with the same reverse current flowing through both Schottky-barriers the voltage at the output terminal varies with the operating temperature of the Schottky-barriers, b. means for applying a voltage over the series combination of Schottky-barriers for producing substantially equal reverse currents through said Schottky-barriers, c. said temperature sensing apparatus being closely thermally coupled to an object the temperature of which is to be regulated, d. and temperature modifying means for opposing changes in temperature of said object, coupled to the output terminal and controlled by the temperature-dependent voltage at the output terminal to regulate the temperature of said object.

7. The system of claim 6, wherein said temperature modifying means comprises an electric heater, coupled to said output terminal, whereby a decrease in temperature of said object produces an increase in heat generated by said electric heater.

8. A system as recited in claim 6 wherein the barrier height and barrier area of the first Schottky-barrier are related to the barrier height and barrier area of the Second Schottky-barrier such that at a predetermined operating temperature and with a predetermined reverse current flowing both through Schottky-barriers the voltage subtended by the first Schottky-barrier is the same as the voltage subtended by the second Schottky-barrier.

9. A system as recited in claim 6 wherein:

the first Schottky-barrier includes a metallic silicide in rectifying barrier relationship with N-type silicon;

the second Schottky-barrier includes the same type metallic silicide in rectifying barrier relationship with P-type silicon; and the common portion therebetween is a metal electrode in contact with both metallic silicides.

10. A system as recited in claim 9 wherein: the N-type and P-type portions are included in a semiconductive wafer which further includes a heavily doped $N^+$-type portion contiguous with the N-type portion for facilitating ohmic contact thereto.

11. A system as recited in claim 10 further including a metallic silicide contiguous with and making substantially ohmic contact to the $N^+$-type portion, this last-mentioned metallic silicide being of the same type as the metallic silicides forming the rectifying barriers.

* * * * *